(12) United States Patent
Maehara

(10) Patent No.: US 8,766,629 B2
(45) Date of Patent: Jul. 1, 2014

(54) FREQUENCY CONVERSION APPARATUS AND FREQUENCY CONVERSION METHOD

(75) Inventor: Hiroki Maehara, Tokyo (JP)

(73) Assignee: Canon Anelva Corporation, Kanagawa (JP)

( * ) Notice: Subject to any disclaimer, the term of this patent is extended or adjusted under 35 U.S.C. 154(b) by 656 days.

(21) Appl. No.: 12/606,457

(22) Filed: Oct. 27, 2009

(65) Prior Publication Data

US 2010/0264959 A1  Oct. 21, 2010

Related U.S. Application Data

(63) Continuation of application No. PCT/JP2009/057765, filed on Apr. 17, 2009.

(51) Int. Cl.
*G11C 11/02* (2006.01)
*G01R 33/02* (2006.01)
*H03D 7/00* (2006.01)

(52) U.S. Cl.
USPC ............ 324/252; 455/325; 455/318; 257/421

(58) Field of Classification Search
USPC ..................... 257/421; 455/325, 318; 324/252
See application file for complete search history.

(56) References Cited

U.S. PATENT DOCUMENTS

| | | | |
|---|---|---|---|
| 7,504,898 B2 * | 3/2009 | Fukuzawa et al. | 331/96 |
| 7,991,377 B2 | 8/2011 | Kakinuma et al. | 455/323 |
| 8,131,249 B2 * | 3/2012 | Maehara | 455/325 |
| 2007/0063690 A1 * | 3/2007 | De Wilde et al. | 324/117 R |
| 2007/0109147 A1 | 5/2007 | Fukuzawa et al. | 340/903 |
| 2008/0150643 A1 | 6/2008 | Suzuki et al. | 331/107 R |

FOREIGN PATENT DOCUMENTS

| | | |
|---|---|---|
| JP | 7-321514 A | 12/1995 |
| JP | 2006-295908 A | 10/2006 |
| JP | 2007-124340 A | 5/2007 |
| JP | 2007-235119 A | 9/2007 |
| JP | 2009-246615 | 10/2009 |

OTHER PUBLICATIONS

J.C. Slonczewski, "Current-driven excitation of magnetic multilayers," Journal of Magnetism and Magnetic Materials, vol. 159, pp. L1-L7, (1996).
A.A. Tulapurkar et al., "Spin-torque diode effect in magnetic tunnel junctions," Nature, vol. 438, pp. 339-342 (Nov. 17, 2005).
Office Action issued Jan. 6, 2010 in counterpart Japanese Patent Application No. 2009-546152, with translation.

* cited by examiner

*Primary Examiner* — Arnold Kinkead
(74) *Attorney, Agent, or Firm* — Fitzpatrick, Cella, Harper & Scinto

(57) ABSTRACT

To provide a frequency conversion device which uses a magneto-resistive device and thereby can correspond to a Si-based MMIC and a GaAs-based MMIC. A frequency conversion apparatus according to the present invention includes: a frequency conversion device made of a magneto-resistive device including a magnetic free layer, an intermediate layer, and a magnetic pinned layer; a magnetic field applying mechanism for applying a magnetic field to the frequency conversion device; a local oscillator for applying a local oscillation signal to the frequency conversion device; and an input terminal electrically connected to the frequency conversion device, and used to input an external input signal.

10 Claims, 10 Drawing Sheets

1

FREQUENCY CONVERSION APPARATUS AND FREQUENCY CONVERSION METHOD

CROSS-REFERENCES TO RELATED APPLICATIONS

This application is a continuation application of International Application No. PCT/JP2009/057765, filed on Apr. 17, 2009, the entire contents of which are incorporated by reference herein.

TECHNICAL FIELD

The present invention relates to a frequency conversion apparatus which is used to perform frequency conversion in a radio communication apparatus, and the like, and relates to a frequency conversion method.

BACKGROUND ART

A nonlinear device, such as a semiconductor diode and an FET, is used as a conventional frequency conversion device. The purpose of the frequency conversion is to input a signal having a certain frequency into a frequency conversion device, and to output a signal having a frequency component different from that of the input signal from the frequency conversion device.

As a simplest example in which frequency conversion is performed by a nonlinear device, there is considered a case where current is applied to a nonlinear resistance r(i). The current-voltage characteristic of the nonlinear resistance can be subjected to Taylor expansion at a point $x=i-i_0$ around an operating point $(i_0, v_0)$ as expressed by $$v(x) = i_0 + \left(\frac{dv}{di}\right)_{i=i_0} x + \frac{1}{2}\left(\frac{d^2v}{di^2}\right)_{i=i_0} x^2 + \ldots =$$

$$i_0 + a_1 x + a_2 x^2 + a_3 x^3 + \ldots \quad \text{[Expression 1]}$$

When current of a sinusoidal wave with a frequency $\omega$ as expressed by $$x = m \cos \omega t \quad \text{[Expression 2]}$$

is made to flow into such nonlinear resistive device, a voltage expressed by $$v = i_0 + a_1 m \cos \omega t + \frac{1}{2}a_2 m^2(1+\cos 2\omega t) + \frac{1}{4}a_3 m^3 (3\cos \omega t + \cos 3\omega t) + \ldots \quad \text{[Expression 3]}$$

is generated across both the ends of the nonlinear resistive device. Due to the distortion in the output waveform, harmonic wave components of frequencies $2\omega$, $3\omega$, and the like, can be extracted in addition to the component of frequency $\omega$ which is proportional to the input current.

Next, there is considered a case where the signal inputted into the nonlinear device is the sum of two signals having different frequencies $\omega 1$ and $\omega 2$. When the input current is expressed by $$x = m_a \cos \omega_a t + m_b \cos \omega_b t \quad \text{[Expression 4]},$$

a voltage expressed by $$v = i_0 + a_1 m_a \cos \omega_a t + a_1 m_b \cos \omega_b t + \frac{1}{2}a_2 m_a^2(1+\cos 2\omega_a t) + \frac{1}{2}a_2 m_b^2(1+\cos 2\omega_b t) + a_2 m_a m_b \{\cos(\omega_a + \omega_b)t + \cos(\omega_a - \omega_b)t\} + \ldots \quad \text{[Expression 5]}$$

is generated across both the ends of the nonlinear resistive device. Thus, it is possible to extract a frequency ($\omega 1 + \omega 2$) which is the sum of the frequencies of the input signals, and a frequency ($\omega 1 - \omega 2$) which is the difference between the frequencies of the input signals. In particular, the device which extracts the sum of the frequencies of the input signals is referred to as an up-converter, while the device which extracts the difference between the frequencies of the input signals is referred to as a down-converter.

In this way, the frequency conversion means to generate a signal having a frequency different from that of an input signal. The frequency conversion, which extracts a frequency of twice or an integer multiple of a certain frequency of an input signal as expressed by Expression 1, is referred to as frequency multiplication. The frequency conversion according to the present invention is assumed to include the frequency multiplication.

The frequency conversion is a very important technique. For example, a frequency conversion device is used for frequency mixing in a transmitter or a receiver in the wireless communication field. Further, a combination of a microwave oscillator and a frequency multiplication device is used to generate a millimeter wave signal or a sub-millimeter wave signal, because there is no suitable oscillator which can directly generate a signal having these frequency bands.

Generally, in the nonlinear devices used for frequency conversion, there are mainly used nonlinear characteristics exhibited by semiconductor devices, such as a diode and an FET. In many cases, a Schottky diode is used as a frequency conversion device which is used in a microwave integrated circuit (MIC) formed by mounting discrete devices on a dielectric substrate. Further, as a frequency conversion device used for frequency multiplication, a reversely biased diode is used as a nonlinear capacitive device (varactor) in many cases.

There is known a monolithic microwave integrated circuit (MMIC) which is realized by collectively and integrally manufacturing an active device, a passive device, a passive active device, and the like, on a same substrate by using a semiconductor process. In the MMIC, many FETs are used in active devices, such as an amplifier and an oscillator, and hence it is difficult to incorporate a diode designed exclusively for frequency conversion into the MMIC because of restrictions for consistency in the manufacturing process, and the like. Therefore, in many cases, the nonlinearity of FET itself is used for the frequency conversion device in the MMIC. Further, in the case where a frequency conversion device is incorporated into the MMIC, there is a restriction in the circuit area from a viewpoint of the degree of integration. Therefore, it is desired that the frequency conversion device also has a small scale. The MMIC is roughly divided into a type constituted by a Si-based device, and a type constituted by a compound semiconductor device. The Si-based device and the compound semiconductor device both have merits and demerits. However, in a monolithic microwave integrated circuit (MMIC), it is difficult to mixedly mount these devices on a same substrate. This is because in the epitaxial growth, which is necessary in the film-forming process of each of the devices in many cases, a silicon substrate is used in the Si-based MMIC, and a substrate made of GaAs, or the like, is used in the compound semiconductor. The compatibility between the manufacturing processes of the Si-based device and of the compound semiconductor device is significantly low.

Further, in general, a frequency conversion device using a semiconductor does not have the frequency selectivity in the frequency conversion device itself. Therefore, in the case where the frequency conversion is desired to be performed only with respect to a certain specific frequency, it is necessary to provide a filter, and the like. In the frequency conversion device using a semiconductor, it is not possible to provide a switching function in the frequency conversion function itself.

On the other hand, a giant magneto-resistive device (GMR) and a tunnel magneto-resistive device (TMR), which exhibit the magneto-resistive effect, have been applied as a sensor and a memory device. This utilizes the characteristics that, on the basis of the fact that the resistance value of the magneto-resistive device is changed in correspondence with the relative angle between the magnetic moments of the magnetic free layer and the magnetic pinned layer in the magneto-resistive device, a change in the external magnetic field can be detected as a change in the resistance value (sensor effect), and magnetic hysteresis is obtained as the hysteresis of the resistance value (memory effect). Further, in recent years, there has been promoted the application of devices in which spin injection torque is used in addition to the magneto-resistive effect. As described in Non-Patent Document 1, the spin injection torque means magnetic torque that is generated in a local magnetic moment by the exchange of angular momentum between a conduction electron and a local electron, which exchange is caused at the time when spin polarized current is made to flow into a ferromagnetic material. For this reason, there has been promoted the application of a microwave oscillator, a microwave detection device, a microwave amplifier, and the like, which use a non-linear effect caused by spin-injection magnetization reversal that enables magnetization reversal without using an external magnetic field, and a non-linear effect caused by the precession of magnetization induced by the spin injection torque (Patent Document 2).

The microwave detection device, which is described in Non-Patent Document 3, and the operation principle of which is based on the homodyne detection method, is capable of detecting a DC voltage corresponding to an input AC current signal. The microwave detection device uses the non-linear effect that the resistance value of a magneto-resistive device is periodically changed when the magnetic moment of the magneto-resistive device is caused to precess by the spin torque induced by the AC signal applied to the magneto-resistive device. The frequency of the change in resistance value is equal to the frequency of the inputted AC signal, and the effect as expressed by Expression 1 is exhibited. Non-Patent Document 3 describes that the homodyne detection is performed by using such non-linear effect, and also describes another important technique. That is, Non-Patent Document 3 describes a technique using a spin injection FMR effect. In the case of minute AC current, the current value is very small. Thus, the induced precession of magnetization is also very small, and hence the output DC voltage is very small. However, when the frequency of the input AC current signal is in the vicinity of a ferromagnetic resonance frequency, the precession of magnetization is amplified by the resonance effect. Thereby, a larger DC voltage can be detected. The detection function realized by using such magneto-resistive device is referred to as a spin torque diode effect. In this way, the ferromagnetic resonance is also caused by the spin injection torque, and further the nonlinear effect of the magneto-resistive device is fully exhibited by using the ferromagnetic resonance. Therefore, such effects are expected to be applied in the microwave band.

Non-Patent Document 1: Slonczewski, J. C. Current-driven excitation of magnetic multilayers. J. Magn. Magn. Mater. 159, L1-L7 (1996).

Non-Patent Document 2: Tulapurkar, A. A. et al. Spin-torque diode effect in magnetic tunnel junctions. Nature 438, 339-342 (2005).

Patent Document 1: Japanese Patent Application Laid-Open No. 2006-295908

SUMMARY OF THE INVENTION

The frequency conversion device using a semiconductor, such as a semiconductor diode and an FET, has a wide frequency band, and hence cannot perform frequency conversion in a frequency-selective manner. Further, in such frequency conversion device, a switching function cannot be given to the frequency conversion function itself.

In the conventional frequency conversion device using a semiconductor device, from the view point of manufacturing process, there are restrictions in materials and devices which can be used in the Si-based MMIC and the GaAs-based MMIC. However, by using a magneto-resistive device, it is possible to provide a frequency conversion device which can be used both in the Si-based MMIC and the GaAs-based MMIC.

A frequency conversion apparatus according to the present invention includes:
a frequency conversion device made of a magneto-resistive device which includes a magnetic free layer, an intermediate layer, and a magnetic pinned layer;
a magnetic field applying mechanism for applying a magnetic field to the frequency conversion device;
a local oscillator for applying a local oscillation signal to the frequency conversion device; and
an input terminal electrically connected to the frequency conversion device, and used to input an external input signal.

The magnetic field applying mechanism is a permanent magnet. Further, the direction of the magnetic field applied by the permanent magnet is not in parallel to the easy axis direction of the magnetic pinned layer of the frequency conversion device.

The magnetic field applying mechanism is configured by further including
a current magnetic field applying mechanism for generating a current magnetic field, and
a power source capable of applying a current to the current magnetic field applying mechanism, and
is configured such that the applying direction of the current magnetic field is not in parallel to the easy axis direction of the magnetic pinned layer of the frequency conversion device.

The frequency conversion apparatus according to the present invention further includes a control section which can control the magnetic field applied to the frequency conversion device by controlling the current applied to the current magnetic field applying mechanism.

The frequency conversion apparatus according to the present invention further includes a feedback circuit which detects an output of the frequency conversion device, and which applies feedback to the control section so that the ferromagnetic resonance frequency is set to a desired frequency.

The control section is configured to turn on and off the magnetic field applied to the frequency conversion device by turning on and off the current applied to the current magnetic field applying mechanism.

The frequency conversion method according to another aspect of the present invention is a method which inputs an external input signal and a local oscillation signal into a frequency conversion device made of a magneto-resistive device that includes a magnetic free layer, an intermediate layer, and a magnetic pinned layer, and which converts the frequency of the external input signal. The method is characterized in that one of the frequency of the external input signal and the frequency of the local oscillation signal is included in the ferromagnetic resonance frequency band of the magnetic free layer of the frequency conversion device.

In the frequency conversion method, there is applied a magnetic field which is not in parallel to the easy axis direction of the magnetic pinned layer of the frequency conversion device.

When the signal frequency of one of the plurality of input signals is in the vicinity of the magnetic resonance frequency of the magnetic free layer in the magneto-resistive device, the precession of magnetization is amplified by the spin injection torque, so that the frequency conversion of the one input signal is performed by the nonlinearity of the resistance of the magneto-resistive device, which nonlinearity is caused by the amplified precession of magnetization. Since the frequency band of the magnetic resonance frequency is narrow, the frequency conversion is performed only when the frequency of at least one of the plurality of input signals inputted into the magneto-resistive device is in the vicinity of the ferromagnetic resonance frequency, while the frequency conversion is not performed when the frequencies of the input signals are deviated from the ferromagnetic resonance frequency band. By using these effects, it is possible to perform frequency conversion in a frequency selective manner. Further, by changing the magnitude of the magnetic field applied to the frequency conversion device, it is possible to provide a switching function in the frequency conversion effect.

A frequency conversion device according to the present invention uses a magnetic resonance frequency excited by spin injection torque, and hence is capable of performing frequency conversion by selecting a specific frequency.

BEST MODES FOR CARRYING OUT THE INVENTION

Figure 1:
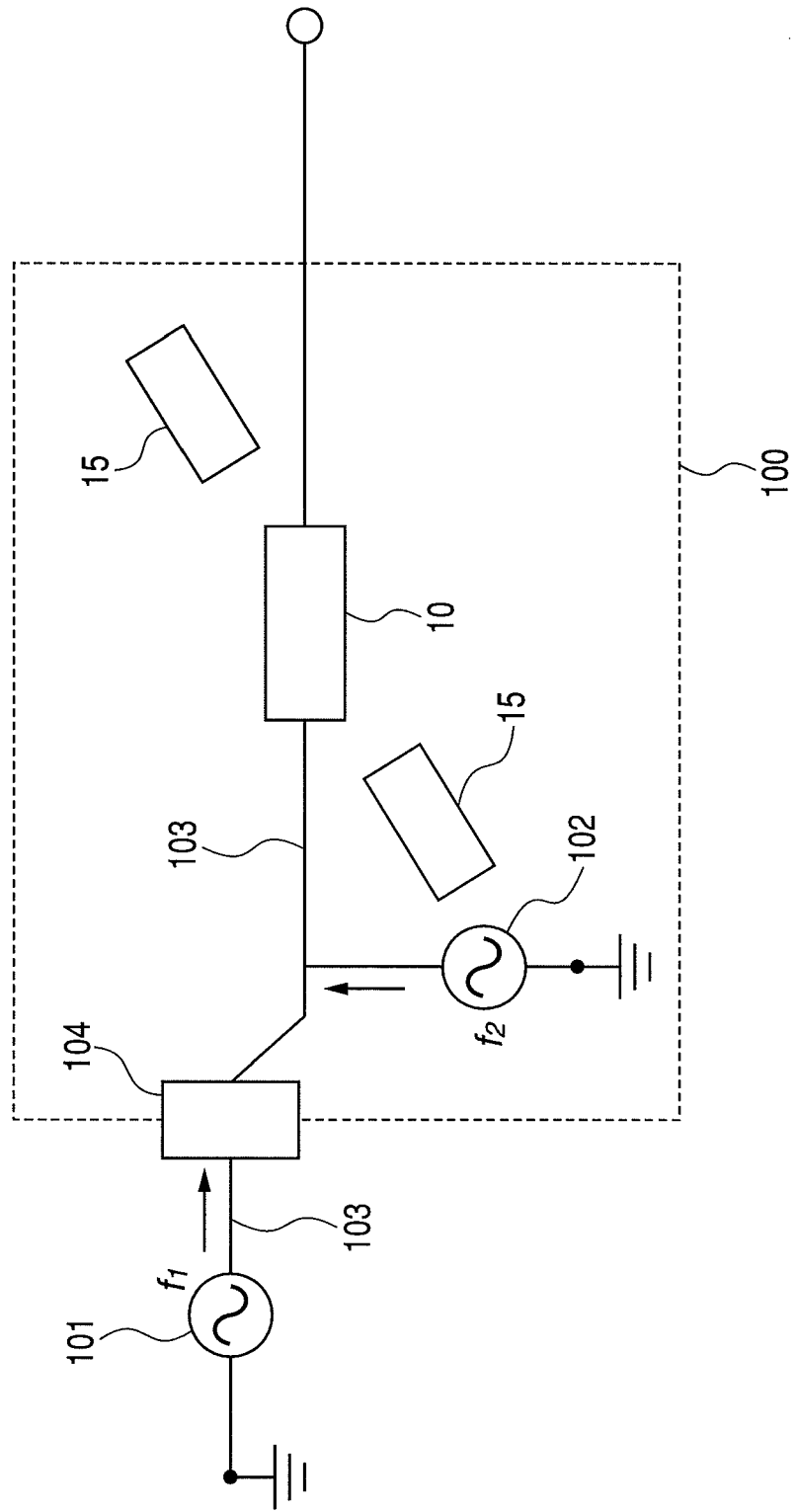
FIG. 1 is a diagram showing a schematic configuration of a first frequency conversion apparatus including the frequency conversion device.

FIG. 1 shows an example of a frequency conversion apparatus according to the present invention. A frequency conversion apparatus 100 is characterized by including: a frequency conversion device 10 made of a magneto-resistive device; a magnetic field applying mechanism 15 which applies a magnetic field to the frequency conversion device 10; a local oscillator 102; an input terminal 104; and a wiring 103 which electrically connects the frequency conversion device 10 to each of the input terminal 104 and the local oscillator 102. The frequency conversion apparatus 100 is an apparatus which performs frequency conversion by the frequency conversion device 10 so as to output a difference signal between the high frequency signal $f_1$ inputted from an input signal source 101 and a high frequency signal $f_2$ applied by the local oscillator 102. The frequency conversion apparatus 100 includes the magnetic field applying means 15 for controlling the function of the frequency conversion device. In the present embodiment, the magnetic field applying means (magnetic field applying mechanism) is configured by a permanent magnet, a coil, and the like. However, the magnetic field applying mechanism is not limited to these as long as the mechanism is capable of applying a magnetic field to the frequency conversion device 10.

The frequency conversion device 10 according to the present invention includes a magneto-resistive device based on a three-layer structure having a magnetic free layer (ferromagnetic layer), an intermediate layer, and a magnetic pinned layer (ferromagnetic layer). As a material of the intermediate layer, there are listed alumina, magnesium oxide, copper, and the like. The nonlinearity for obtaining the frequency conversion effect is originated from the device resistance change based on the magneto-resistive effect. Therefore, it is preferred to use a magneto-resistive device which has a large magneto-resistance ratio (MR ratio of 100% or more).

Thus, with reference to FIG. 2, there will be described a structure of a frequency conversion device using a tunnel magneto-resistive device which has an MgO barrier layer as the intermediate layer. However, in carrying out the present invention, the magnet-resistive device to be used is not limited only to the above described magneto-resistive devices.

Figure 2:
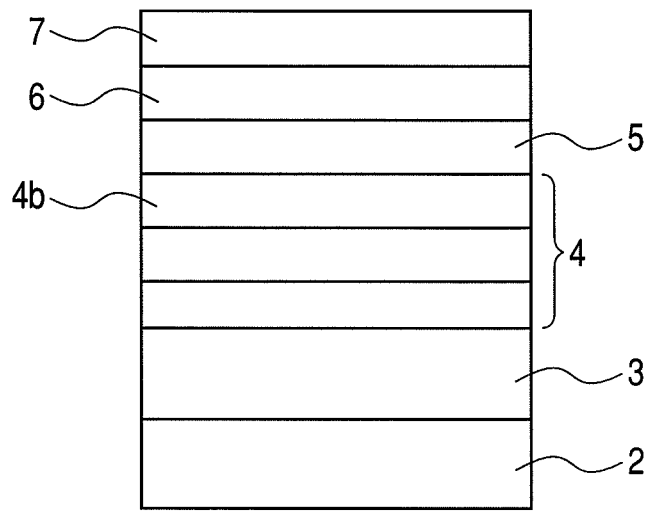
FIG. 2 is a schematic diagram of a cross section of a frequency conversion device according to the present embodiment.

FIG. 2 is a schematic diagram of a cross section of a frequency conversion device according to the present embodiment.

Specific structures of respective layers are described with reference to FIG. 2. A dia-ferromagnetic layer 3 made of PtMn (15 nm) is provided on a lower electrode Layer 2, and a magnetic pinned layer 4 is a laminated ferri-pinned layer made of CoFe (2.5 nm)/Ru (0.85 nm)/CoFeB (3 nm). A layer denoted by reference character 4b is made of CoFeB and corresponds to the magnetic pinned layer. A tunnel barrier layer (intermediate layer) 5 is made of MgO (1.0 nm). A magnetic free layer 6 is made of CoFeB (2 nm). A laminated structure of Ta (5 nm)/Ru (7 nm) is used as a protective layer 7. Note that each of the numerals inside the parentheses represents a film thickness.

In the present embodiment, the film thicknesses of the magnetic pinned layer and the magnetic free layer are set, to 3 nm and 2 nm, respectively, but the thicknesses of the layers are not limited to these. Similarly, the above described film thicknesses are examples and are not limited to these. However, the magnetic moment of the magnetic pinned layer needs to be smaller than that of the magnetic free layer. This is because when the magnetic moment of the magnetic pinned layer is larger than that of the magnetic free layer, the precession is caused in the magnetic pinned layer by the spin injection torque.

The frequency conversion device is formed by processing a magneto-resistive thin film into a columnar shape of junction area of a 1 µm² or less. In order to allow the spin injection torque to effectively operate, it is preferred to reduce the junction area of the frequency conversion device. Preferably, the junction area is reduced to 0.04 µm² or less.

Since the signal inputted into the frequency conversion device 10 is a high frequency signal, it is preferred to use, as the wiring 103, a slot line, a microstrip line, a coplanar waveguide, and the like, in which impedance matching is sufficiently taken into consideration. Further, it is preferred that the impedance matching in the wiring 103 from the input signal source 101 to the frequency conversion apparatus 100 is also taken into consideration.

Figure 3:
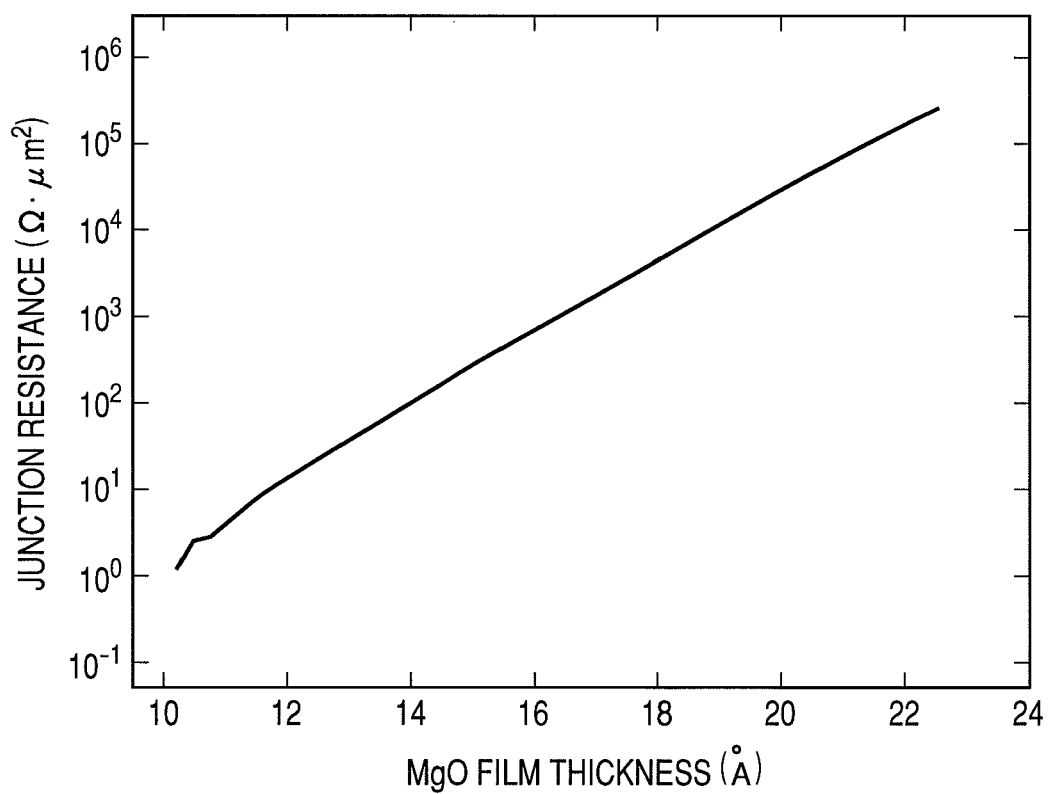
FIG. 3 is a diagram for explaining a relationship between the film thickness of the intermediate layer and the junction resistance.

Also, it is preferred to effect impedance matching in the frequency conversion device 10 itself. FIG. 3 is a diagram for explaining a relationship between the film thickness of the intermediate layer and the junction resistance. The impedance of the frequency conversion device 10 can be controlled by changing the device size and the thickness of the intermediate layer 5 shown in FIG. 2. For example, in the case where magnesium oxide (MgO) is used as the intermediate layer, the normalized resistance value (normalized by the area of 1 µm×1 µm) of the device can be controlled as shown in FIG. 3 by changing the thickness of the magnesium oxide layer. Thus, it is possible to obtain a desired resistance value with a desired junction area by suitably selecting the film thickness of the magnesium oxide.

Further, when the thickness of the intermediate layer 5 shown in FIG. 3 is fixed, it is possible to effect the impedance matching by controlling the device resistance by changing the junction area of the device.

Figure 4A:
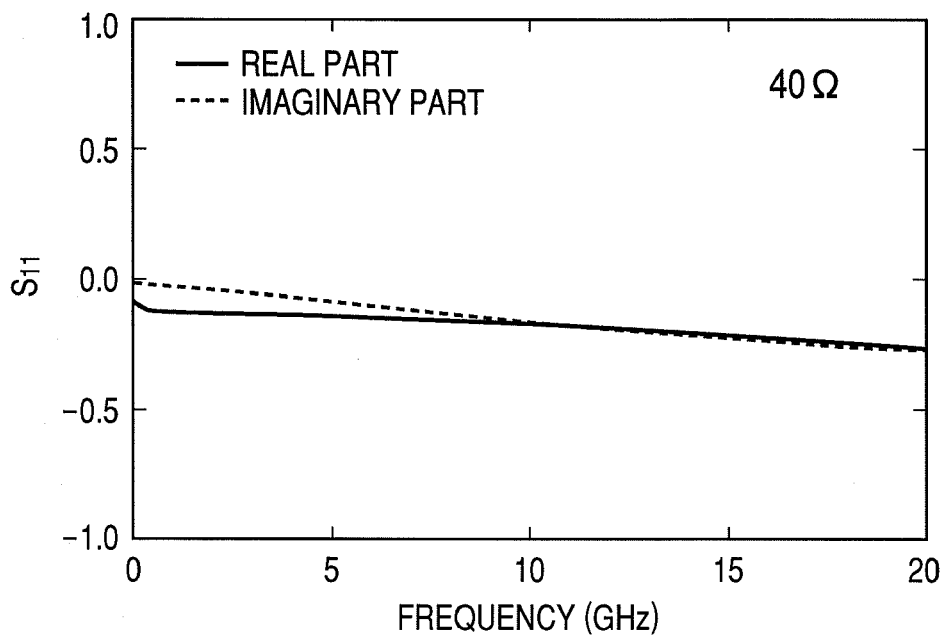
FIG. 4 is a diagram for explaining a transmission characteristic evaluation based on impedance matching of the frequency conversion device.
Figure 4B:
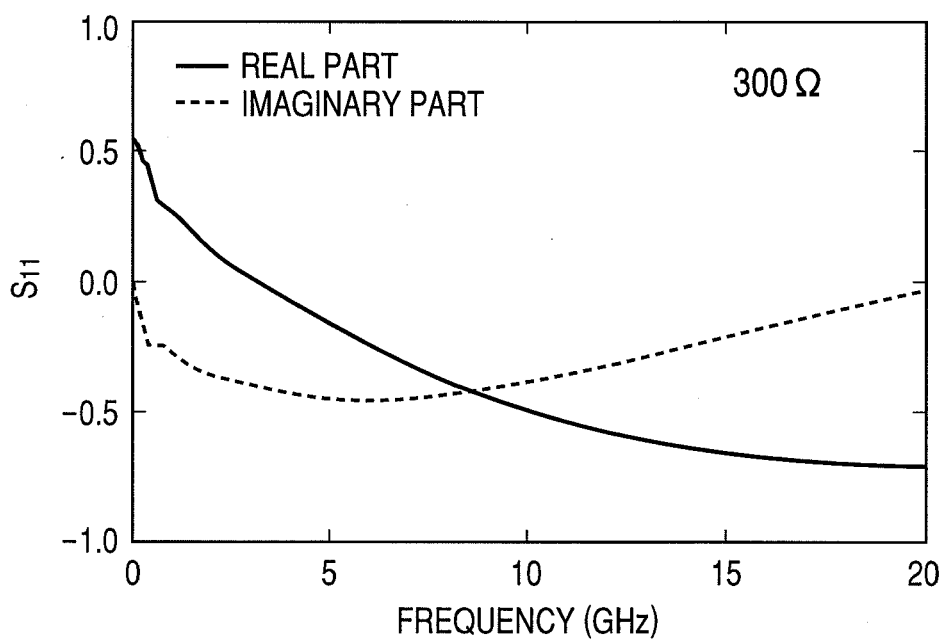

With reference to FIG. 4, there will be described transmission characteristic evaluation based on the impedance matching in the frequency conversion device.

A sample having device resistance of 40Ω and a sample having device resistance of 300Ω were actually prepared by changing the MgO film thickness and the device size. Then, the transmission characteristics of the samples were evaluated by measuring S11 (reflectance) of each of the samples. The evaluation results are shown in FIG. 4. As shown in the evaluation results, it is seen that the device having better impedance matching (FIG. 4A) has a better transmission characteristic. In the sample having device resistance of 40Ω, the transmission efficiency is 0.8 or more over the entire frequency region of 0 to 20 GHz, while in the sample having device resistance of 300Ω the transmission efficiency is less than 0.4.

Next, there will be described a significant feature that is possessed by the frequency conversion device using the magneto-resistive device according to the present invention, and that the frequency conversion device can also be created on a substrate without restriction of substrate material.

As an example, the normalized resistance value and the magneto-resistance ratio were compared between a frequency conversion device 10 manufactured on a silicon substrate and a frequency conversion device manufactured on a GaAs substrate. The comparison results are shown in Table 1. From the comparison of the normalized resistance value and the magneto-resistance ratio between the frequency conversion device manufactured on the GaAs substrate and the frequency conversion device manufactured on the silicon substrate, it is seen that the characteristics obtained for the respective devices are comparable to each other. Further, frequency conversion devices were similarly manufactured on a silicon substrate with thermally oxidized silicon, an AlTiC substrate (ceramic), a MgO substrate, a glass substrate, a sapphire substrate, and a silicon substrate with silicon nitride, respectively. Then, the normalized resistance value and the magneto-resistance ratio were compared between these devices. As a result, it was seen that the normalized resistance values of all the frequency conversion devices are around 3Ω, and that the variation of the normalized resistance values is less than 1Ω. It was also seen that the magneto-resistance ratio of all the frequency conversion devices is 100% or more. From this, it can be seen that when the frequency conversion device according to the present invention is used, the restrictions imposed on substrate material can be eliminated, unlike the conventional semiconductor frequency conversion apparatus.

TABLE 1

|  | Normalized resistance | Magneto-resistance ratio |
| --- | --- | --- |
| Si | 3.2 Ω | 112% |
| Si + SiO2 | 2.9 Ω | 108% |
| AlTiC | 2.8 Ω | 109% |
| GaAs | 2.9 Ω | 110% |
| MgO | 3.4 Ω | 102% |
| Glass substrate | 3.6 Ω | 106% |
| Sapphire substrate | 2.6 Ω | 101% |
| Si + SiN | 2.9 Ω | 106% |

Figure 5:
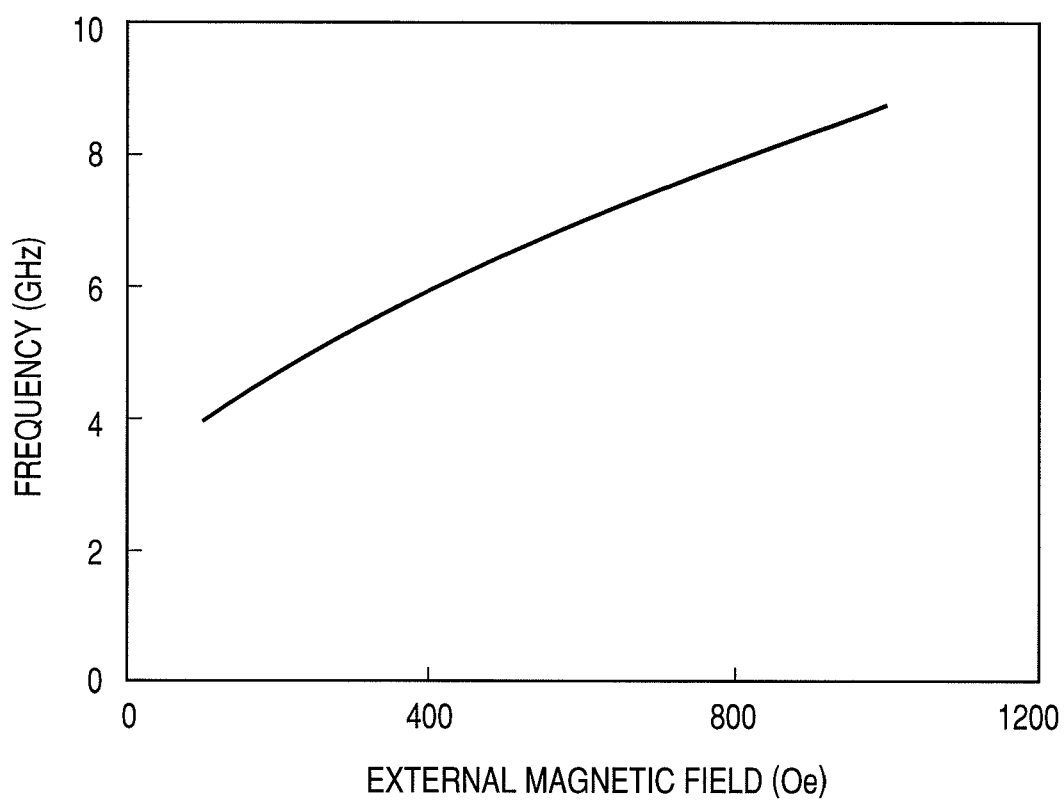
FIG. 5 is a diagram for explaining the external magnetic field dependency of the ferromagnetic resonance frequency of the frequency conversion device.

When the frequency of one of a plurality of signals inputted into the frequency conversion device 10 is included in the ferromagnetic resonance frequency band of the magnetic free layer in the frequency conversion device, the precession of magnetization is amplified by the spin injection torque to cause nonlinearity in the device resistance. Thereby, the frequency of the input signal is converted by the nonlinearity of the device resistance. The frequency band of the ferromagnetic resonance frequency is narrow. Thus, only when the frequency of at least one of the plurality of signals inputted into the magneto-resistive device is in the frequency band in the vicinity of the ferromagnetic resonance frequency, the frequency conversion is performed, while when the frequency of all the input signals is deviated from the ferromagnetic resonance frequency band, the frequency conversion is not performed. Therefore, in order to realize the frequency conversion by using the frequency conversion device using the magneto-resistive device, it is necessary that the frequency of at least one of the input signals is included in the ferromagnetic resonance frequency band. The ferromagnetic resonance frequency band of the magnetic free layer 6 is a material-dependent parameter, but can be changed by applying an external magnetic field to the magnetic free layer 6 shown in FIG. 2. As an example, there is shown in FIG. 5 the external magnetic field dependency of the ferromagnetic resonance frequency of the frequency conversion device manufactured at this time. The spin torque diode effect was used for the measurement of the ferromagnetic resonance frequency. As shown in the measurement result, the ferromagnetic resonance frequency can be changed in a range from about 2 GHz to about 9 GHz by applying an external magnetic field. The measurement result is an example, and a higher resonance frequency can be obtained by applying a larger magnetic field.

Figure 6:
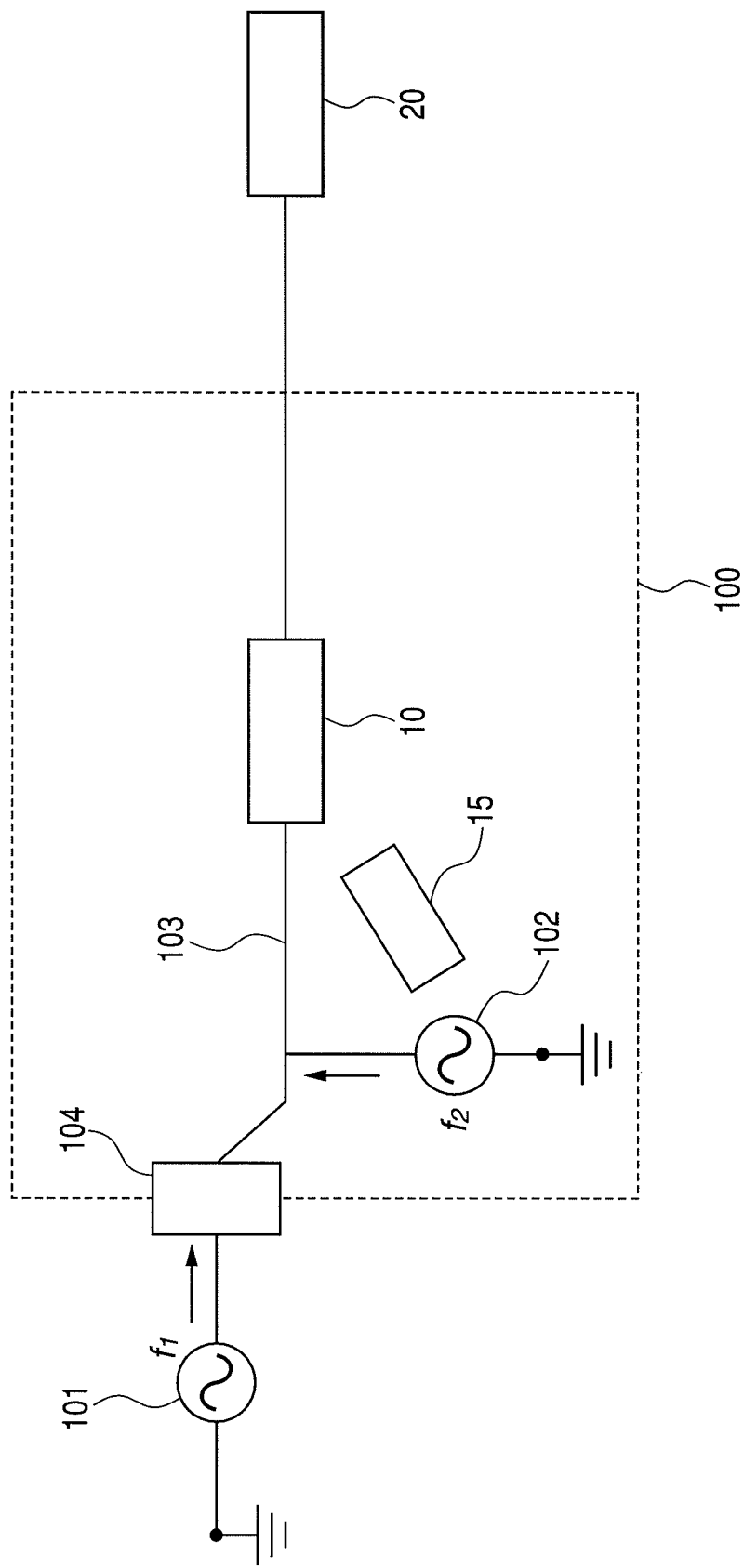
FIG. 6 is a diagram showing a schematic configuration of a second frequency conversion apparatus including the frequency conversion device.

FIG. 6 is a diagram showing a schematic configuration of a second frequency conversion apparatus including the frequency conversion device. As shown in FIG. 6, the ferromagnetic resonance frequency is set to 4.72 GHz in such a manner that the permanent magnet 15 is arranged at a place some distance from the frequency conversion device 10 so as to apply a suitable external magnetic field to the frequency conversion device 10. However, the applying direction of the external magnetic field is set in the direction to which the magnetization of the magnetic pinned layer 4 and the magnetization of the magnetic free layer 6 are likely to be directed, and which is inclined at 30° with respect to the easy axis direction of the magnetic pinned layer 4. In the present embodiment, the applying direction of the external magnetic field is set in the direction inclined at 30°, but any angle may be selected other than 0° or 180°. This is because when the applying direction of the external magnetic field is set in the direction inclined at 0° or 180°, and when the magnetization of the magnetic free layer 6 precesses with the easy axis direction of the magnetic pinned layer 4 as the axis of rotation, the magnetization of the magnetic free layer 6 perform a rotationally symmetrical movement, so that the relative angle between the magnetic moments of the magnetic free layer 6 and the magnetic pinned layer 4 is almost unchanged and hence the resistance of the magneto-resistive device is not changed.

Note that only one permanent magnet 15 is arranged on one side of the frequency conversion apparatus in FIG. 6, but the permanent magnet 15 may also be arranged on both sides of the frequency conversion apparatus.

A high frequency signal $f_1=3$ GHz is inputted into the frequency conversion apparatus 100 from the input signal source 101, and a high frequency signal $f_2=4.72$ GHz is inputted into the frequency conversion device 10 from the local oscillator 102. As shown in FIG. 6, a magnetic field which sets the ferromagnetic resonance frequency to 4.72 GHz is applied to the frequency conversion device 10 by the permanent magnet 15. Therefore, a difference signal between 3 GHz and 4.72 GHz is outputted from the frequency conversion device 10. In order to observe the difference signal, a spectrum analyzer 20 is connected to the output side of the frequency conversion apparatus 100.

Figure 7:
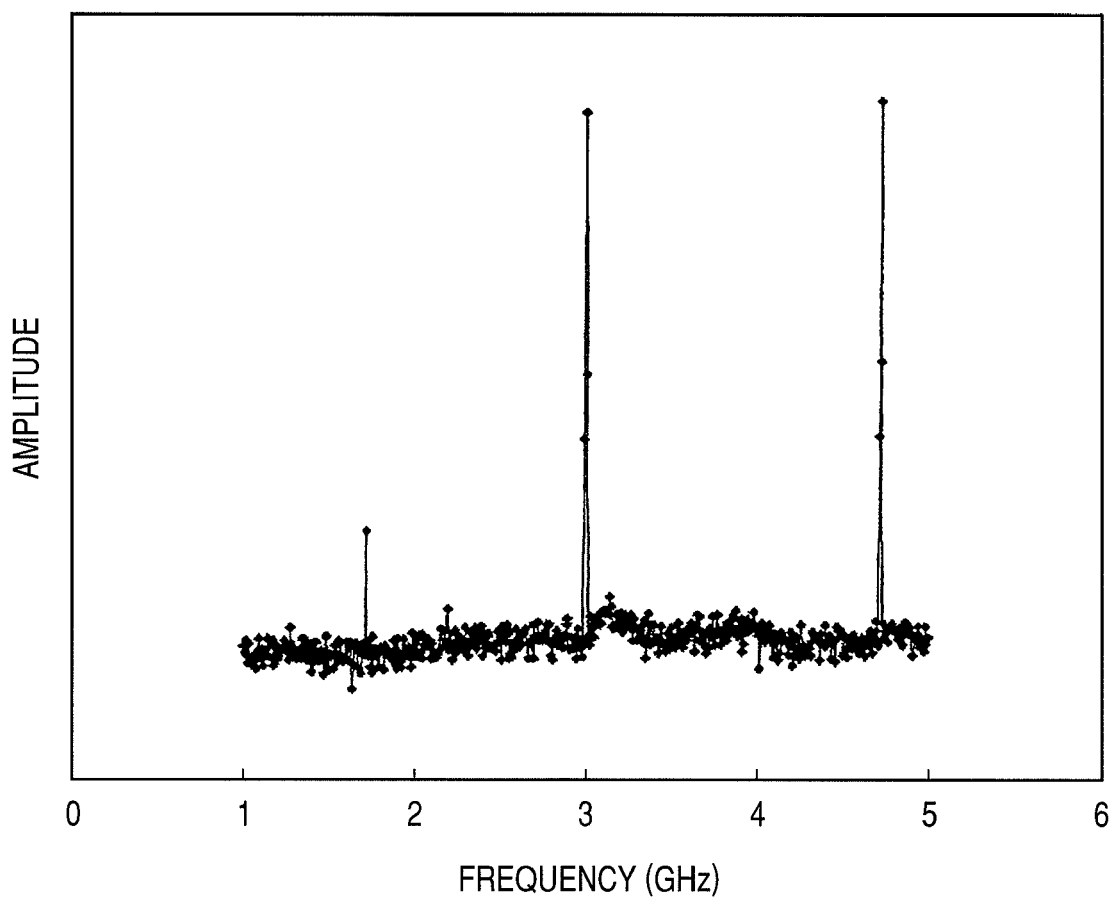
FIG. 7 is a diagram showing a result of frequency conversion performed by using the second frequency conversion apparatus.

FIG. 7 shows an output signal observed by the spectrum analyzer 20. From the fact that there is observed a signal of 1.72 GHz which corresponds to the difference signal between the input signal of 3 GHz and the local oscillation signal of 4.72 GHz, it is seen that the frequency conversion is performed.

Figure 8:
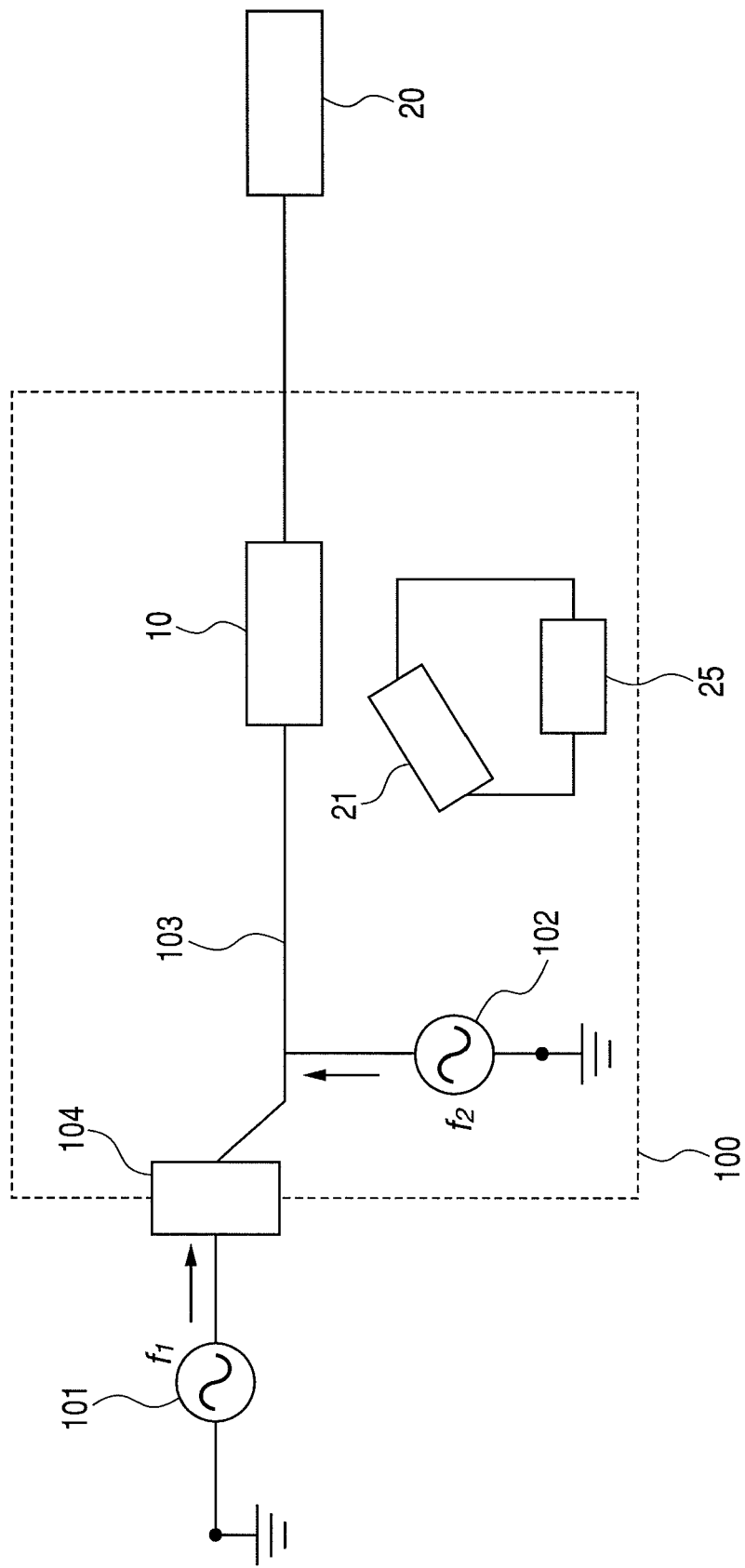
FIG. 8 is a diagram showing a schematic configuration of a third frequency conversion apparatus including the frequency conversion device.

FIG. 8 is a diagram showing a schematic configuration of a third frequency conversion apparatus including the frequency conversion device. In the above described embodiment, the permanent magnet is used as the magnetic field applying mechanism 15. However, a current induced magnetic field may also be applied to the frequency conversion device 10 by arranging a coil 21 as shown in FIG. 8. In this case, the magnitude of the magnetic field can be controlled not only by the arrangement position of the coil 21 but also by the magnitude of current applied to the coil 21 and the number of turns of the coil 21. Therefore, it is preferred to provide a controlling power source (control section) 25 for controlling the current which is made to flow into the coil 21. Further, in the present embodiment, the coil 21 is used, but the current-induced magnetic field can be realized by a method of using a simple electrical wiring, and the like, other than the method of using the coil. Further, the coil is arranged only on one side of the frequency conversion device 10 in FIG. 8, but the coil may also be arranged on both sides of the frequency conversion device 10.

Further, in the case where the coil 21 is used as means to apply the magnetic field to the frequency conversion device as shown in FIG. 8, the magnitude of the induced magnetic field can be changed by changing the magnitude of current applied to the coil 21. By using this, it is possible to change the ferromagnetic resonance frequency of the frequency conversion device 10.

Next, there will be described a method for providing a switching function in the frequency conversion apparatus according to the present invention. As described above with reference to FIG. 8, the ferromagnetic resonance frequency of the frequency conversion device 10 can be changed in such a manner that the magnitude of the induced magnetic field is changed by changing the magnitude of current applied to the coil 21 by controlling the controlling power source (control section) 25. Further, the ferromagnetic resonance frequency can be changed by turning on and off the induced magnetic field by turning on and off the current applied to the coil 21. By shifting the ferromagnetic resonance frequency band with respect to the frequency of the input signal by using this characteristic, it is possible to operate the switching function for switching whether or not to perform the frequency conversion.

Figure 9:
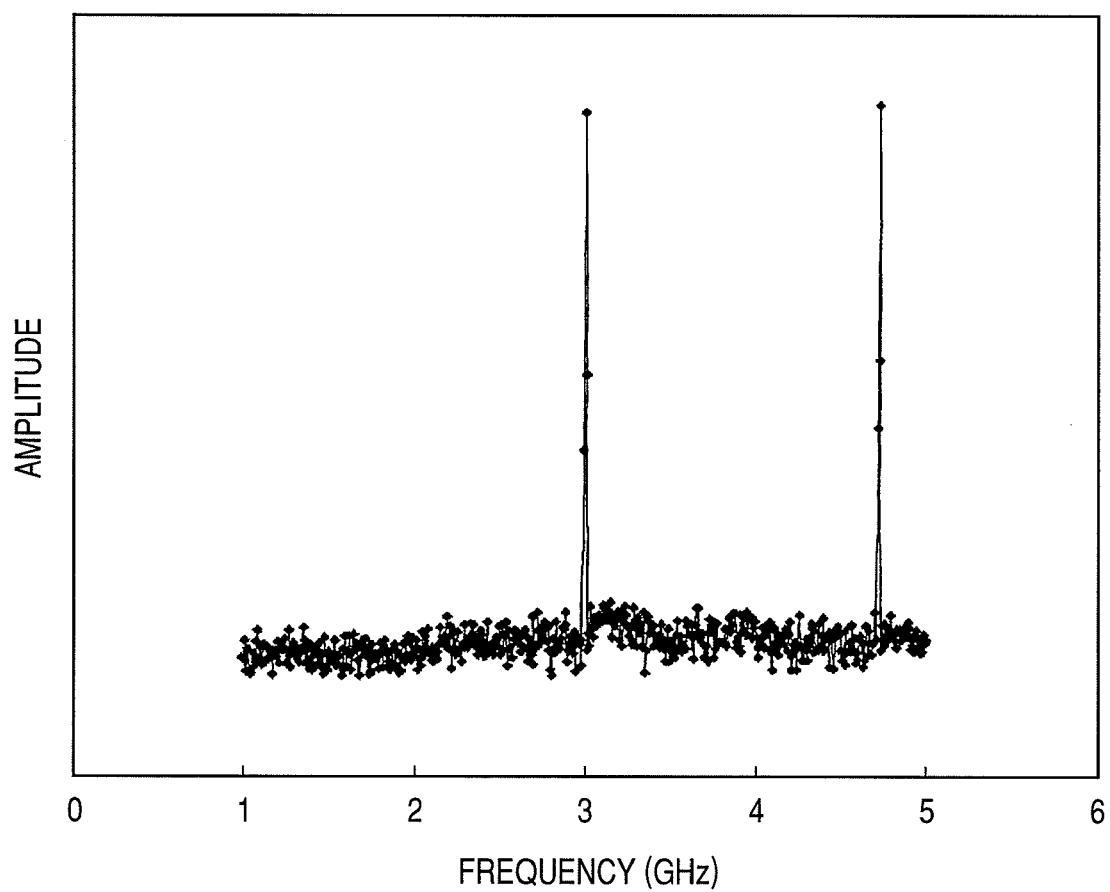
FIG. 9 is a diagram showing a result of frequency conversion performed by using the third frequency conversion apparatus.

Alternatively, the switching function can also be provided by the following method. When in the state where the input signals of 3 GHz and 4.72 GHz were inputted into the frequency conversion device, the direction of the external magnetic field was set in parallel to the easy axis direction of the magnetic pinned layer (pin layer) 4 (the angle was set at)0° by moving the permanent magnet 15 shown in FIG. 6, it was found that the spectrum of 1.72 GHz as the difference signal frequency could not be observed (see FIG. 9), and that the frequency conversion effect was not obtained. As described above, this is because, since the central axis of the precession of the magnetization is set on the easy axis of the magnetization, the resistance change is not obtained and thereby the frequency conversion effect is not obtained.

Further, also in the case where the applying direction of the magnetic field was similarly set antiparallel to the easy axis direction of the magnetic pinned layer (pin layer) (the angle was set at 180°), the difference signal frequency was not observed. In this way, the frequency conversion effect can be turned off by setting the applying direction of the magnetic field at 0° or 180° with respect to the easy axis of the magnetic pinned layer. As described above, in the frequency conversion apparatus according to the present invention, a switching function of switching whether or not to perform the frequency conversion can be provided, in such a manner that the external magnetic field applied to the frequency conversion device is controlled by moving the permanent magnet for applying the external magnetic field.

There are following two methods as the methods for performing the switching of the frequency conversion function.

As one of the methods, there is a method in which the state (switching on state) where the frequency conversion effect is obtained by always applying a suitable external magnetic field to the frequency conversion device, is shifted to the state (switching off state) where the frequency conversion effect is not obtained, by changing the external magnetic field, or is shifted to the state where the frequency of the frequency-converted signal is shifted from the desired frequency band, by shifting the ferromagnetic resonance frequency band. In this method, the frequency conversion function is operated in the normal state, and hence this method is defined as "normally-on method".

Figure 10:
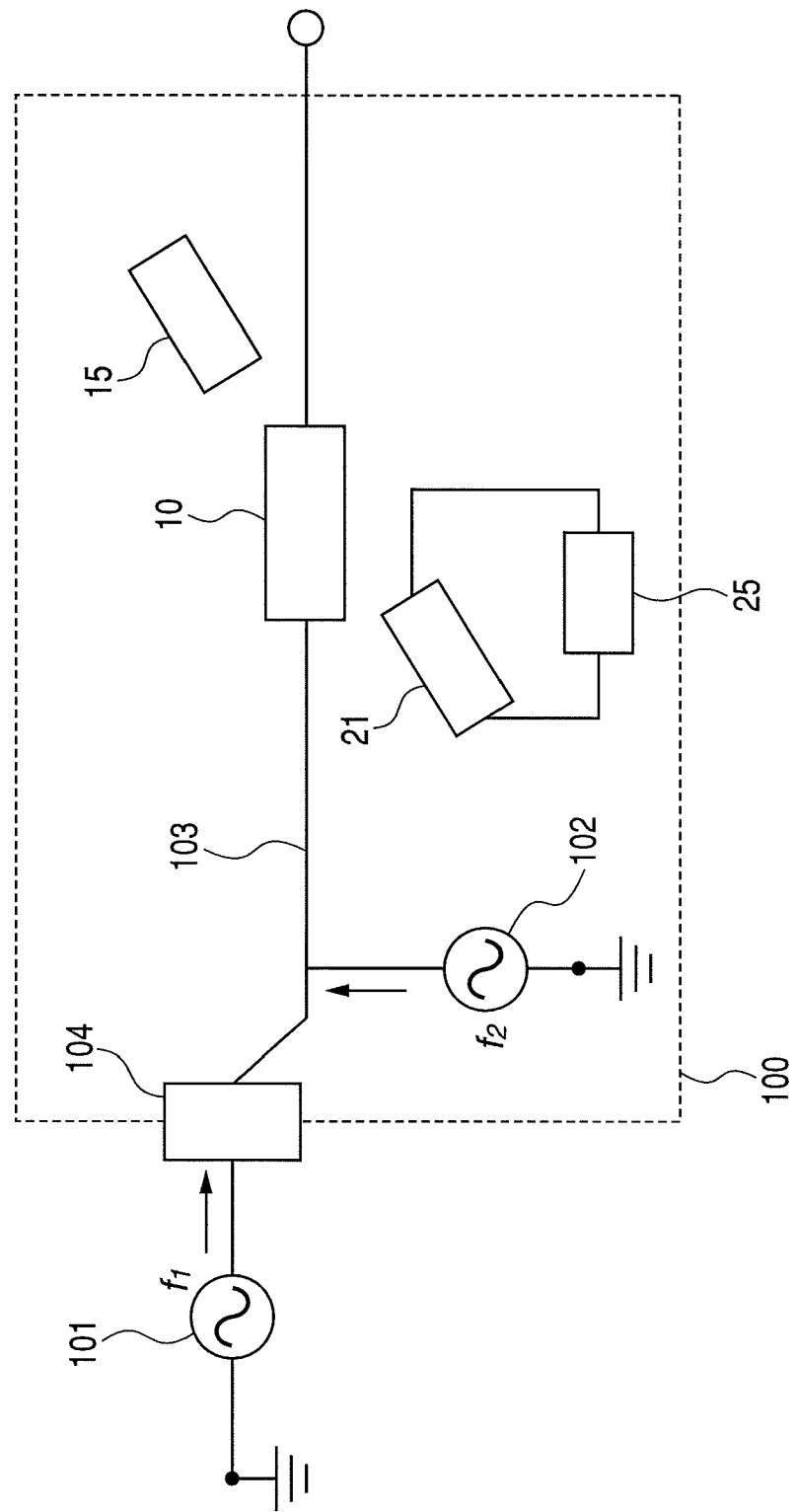
FIG. 10 is a diagram showing a schematic configuration of a fourth frequency conversion apparatus including the frequency conversion device.

FIG. 10 is a diagram showing a schematic configuration of a fourth frequency conversion apparatus including the frequency conversion device. In order to realize a normally-on frequency conversion apparatus, it is preferred to arrange two magnetic field applying mechanisms around the frequency conversion device 10 as shown in FIG. 10. In the present embodiment, the magnetic field is applied by arranging the coil 21 serving as an electromagnet, and the permanent magnet 15 in the vicinity of the frequency conversion device 10.

In particular, the external magnetic field needs to be changed to effect the switching-off state, and hence at least one of the two magnetic field applying mechanisms needs to apply a controllable magnetic field, such as the current-induced magnetic field applied by the coil 21.

When the magnetic field necessary to realize the normally-on state is generated by using the permanent magnet 15, the power consumption can be reduced. This is because, although electric power is needed to generate the current-induced magnetic field by using the coil, and the like, the permanent magnet 15 needs only to be arranged at the side of the frequency conversion device 10 in the case where the permanent magnet 15 is used.

On the other hand, in the case where the frequency of the frequency conversion is made variable by changing the ferromagnetic resonance frequency of the frequency conversion device 10, the current-induced magnetic field generated by using the coil, and the like, is needed to realize the normally-on state.

Further, in the case where the current-induced magnetic field generated by using the coil, and the like, is used to realize the normally-on state, there is also a method in which the switching off-state is realized without using the two magnetic field applying mechanisms. The switching off-state can be realized by using the frequency conversion device 10 in which the direction of the magnetic anisotropy of the magnetic pinned layer 4 is made coincident with the easy axis direction of the magnetic free layer 6 by giving uniaxial magnetic anisotropy to the magnetic free layer 6. In this method, when the current applied to the coil, and the like, is interrupted in the switching on-state, the magnetic field is no longer applied to the frequency conversion device 10. Thereby, the magnetic moment in the magnetic free layer is directed to the easy axis direction, so as to be set parallel or antiparallel to the magnetic moment in the magnetic pinned layer. As a result, the switching off-state can be realized.

As the other switching method, there is a method in which the switching-off state is effected at the time of normal operation, and in which the switching-on state is effected only when the frequency conversion function is required. Since in this method, the frequency conversion function is switched off at the time of normal operation, and hence this method is defined as "normally-off method".

In order to realize the normally-off method, it is necessary to use a current-induced magnetic field generated by a coil, and the like. The magnetic field is not applied to the frequency conversion device at the time of normal operation. When the frequency conversion function is to be turned on, an external magnetic field is applied to the frequency conversion device by supplying current to the coil, and the like. Thereby, there is realized the state where the frequency conversion effect is obtained. In the case where it is desired that the frequency of the frequency conversion is made variable, it is necessary that the current-induced magnetic field generated by the coil, and the like, is made controllable.

There is described an embodiment in which the presence/absence of the frequency conversion effect is switched by arranging the coil 15 at the side of the frequency conversion device 10.

The value of current applied to the coil for generating the current-induced magnetic field is set so that the ferromagnetic resonance frequency of the frequency conversion device is set to 4.72 GHz. The coils is arranged in the direction that is in parallel to the direction in which the magnetic free layer is likely to be directed, and that is inclined at 30° with respect to the easy axis of the magnetic pinned layer. When signals of 3 GHz and 4.72 GHz are inputted into the frequency conversion device 10 in this state (normally-on state), the difference signal frequency of 1.72 GHz is able to be observed similarly to FIG. 7.

When the current applied to the coil 21 is interrupted by turning off the controlling power source 25 in this state, the signal of 1.72 GHz as the difference signal of the input signals can not be observed. In this way, it is possible to realize the normally-on method by controlling the value of current applied to the coil 21.

Further, when the current is supplied to the coil 21 by turning on the controlling power source 25 in the state (switching-off state) where the current is not supplied to the coil 21, the signal of 1.72 GHz as the difference signal frequency is observed. This is the operation in the normally-off state.

In this way, by suitably selecting the magnetic field applying means, it is possible to realize the frequency conversion apparatus which can correspond to both the normally-on method and the normally-off method.

Figure 11:
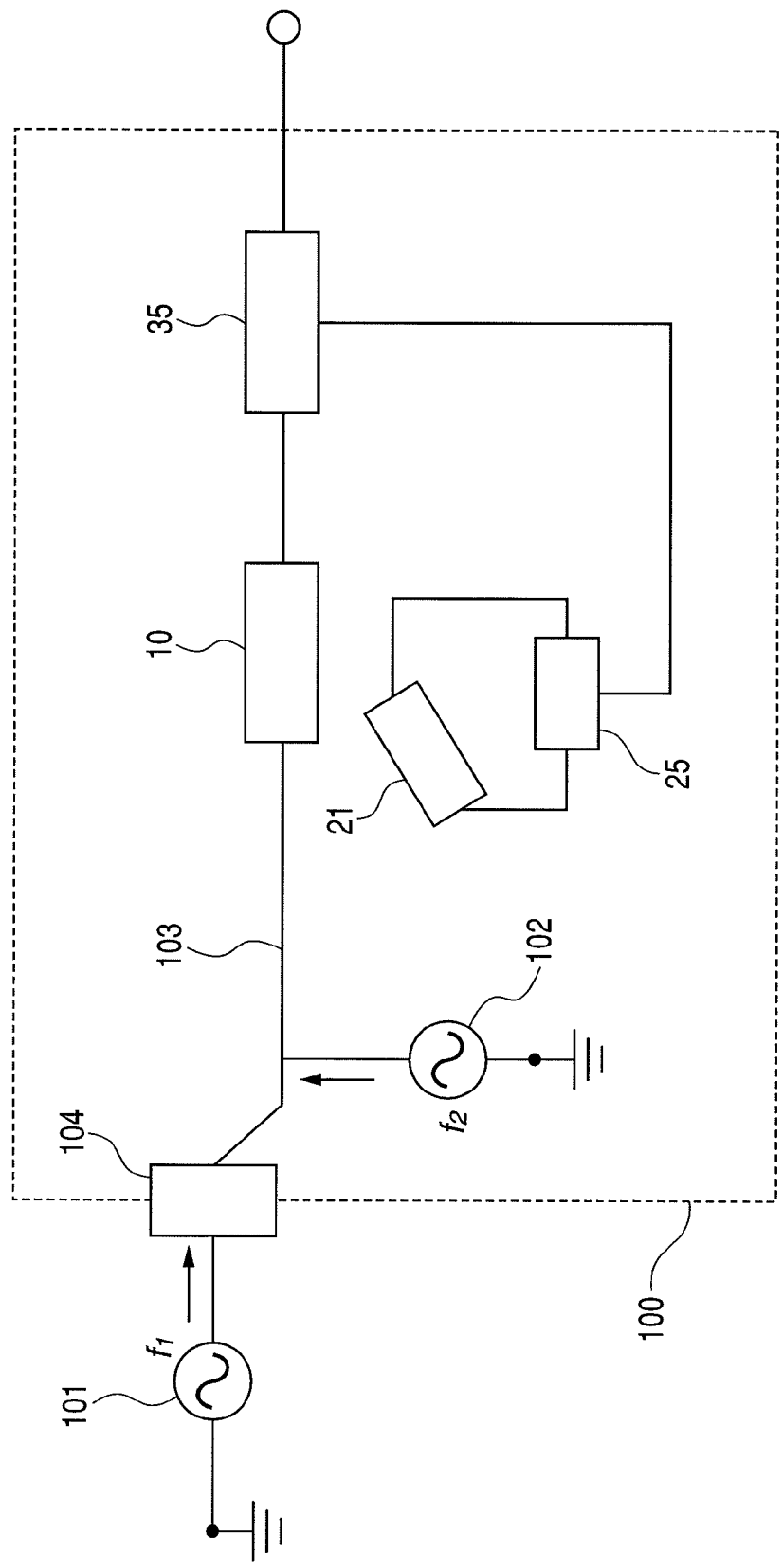
FIG. 11 is a diagram showing a schematic configuration of a fifth frequency conversion apparatus including the frequency conversion device.

FIG. 11 is a diagram showing a schematic configuration of a fifth frequency conversion apparatus including the frequency conversion device.

As shown in FIG. 11, the coil 21, and the controlling power source (control section) 25 which can control the current applied to the coil 21 are arranged in the vicinity of the frequency conversion device 10. Further, there is provided a feedback circuit 35 which is electrically connected to the output side of the frequency conversion device 10, and which is electrically connected to the controlling power source 25 for the coil.

A local oscillation signal of the ferromagnetic resonance frequency which is desired to be set in the frequency conversion device 10 is inputted from the local oscillator 102, and a high frequency signal is inputted from the external signal source 101. For example, the ferromagnetic resonance frequency is set to 4 GHz, and the external input signal is set to have a frequency of 3.8 GHz. Thereby, a signal of 0.2 GHz is to be outputted from the frequency conversion device 10. The output signal is detected by the feedback circuit 35. The feedback circuit 35 is capable of, when the difference signal frequency is not correctly outputted, applying feedback to the controlling power source (control section) 25 to control the magnitude of the current-induced magnetic field generated by the coil 21 so that a desired output is obtained. In this way, when the feedback circuit is used, it is possible to provide the conversion frequency adjusting function in the frequency conversion device.

However, as a frequency used to generate the difference signal frequency of 0.2 GHz with respect to the signal of 3.8 G Hz, there is a signal of 3.6 GHz in addition to the signal of 4 GHz. Therefore, when the above described adjusting process is performed only once, it is not possible to distinguish whether the set ferromagnetic resonance frequency is 4 GHz or 3.6 GHz. Thus, the above described adjusting process is performed once more by setting the frequency of the external input signal to a frequency other than 3.8 GHz. For example, the external input signal $f_1$ is set to 3.4 GHz. If the ferromagnetic resonance frequency is set to 4 GHz in the above described adjusting process, a signal of 0.6 GHz is outputted from the frequency conversion device 10. However, in the case where the ferromagnetic resonance frequency is set to 3.6 GHz in the above described adjusting process, a signal of 0.2 GHz is outputted. In this case, it is necessary to repeat the adjusting process once more. For this reason, it is preferred to mount a memory apparatus to the feedback circuit 35 or the controlling power source 25 for the coil.

In the present embodiments, the local oscillator is used to output the signal of the ferromagnetic resonance frequency, but an output signal of an external signal source may also be used as the ferromagnetic resonance frequency.

DESCRIPTION OF SYMBOLS

2 Lower electrode Layer
3 Dia-ferromagnetic layer (lower electrode layer)
4 Magnetic pinned layer
5 Tunnel barrier layer (intermediate layer)
6 Magnetic free layer
7 Over coat (protection) layer
10 Frequency conversion device
15 Magnetic field applying mechanism
25 Controlling power source (control section)
101 External signal source
102 Local oscillator
103 Wiring
104 Input terminal

The invention claimed is:

1. A frequency conversion apparatus comprising:
a frequency conversion device made of a magneto-resistive device including a magnetic free layer, an intermediate layer, and a magnetic pinned layer;
a magnetic field applying mechanism for applying a magnetic field to said frequency conversion device;
a local oscillator for applying a local oscillation signal to said frequency conversion device; and
an input terminal which is electrically connected to said frequency conversion device, and which is used to input an external input signal,
wherein said magnetic field applying mechanism comprises:
a current magnetic field applying mechanism for generating a current magnetic field; and
a power source for applying current to said current magnetic field applying mechanism, and
wherein the magnetic field applying direction of the current magnetic field is not parallel to the easy axis direction of said magnetic pinned layer of said frequency conversion device.

2. The frequency conversion apparatus according to claim 1, further comprising a control section which controls the magnetic field applied to said frequency conversion device by controlling the current applied to said current magnetic field applying mechanism.

3. The frequency conversion apparatus according to claim 2, further comprising a feedback circuit which detects the output of said frequency conversion device and which applies feedback to said control section to set the output to have a desired ferromagnetic resonance frequency.

4. The frequency conversion apparatus according to claim 2, wherein said control section turns on and off the magnetic field applied to said frequency conversion device by turning on and off the current applied to said current magnetic field applying mechanism.

5. The frequency conversion apparatus according to claim 1, wherein a device size of said magneto-resistive device is 0.04 $\mu m^2$ or less.

6. A switching apparatus comprising:
an input terminal configured to receive an input signal having a first frequency;
a magneto-resistive device connected to said input terminal to receive the input signal, said magneto-resistive device including a magnetic free layer, an intermediate layer, and a magnetic pinned layer;
a local oscillator configured to generate a local oscillation signal having a second frequency and to apply the local oscillation signal to said magneto-resistive device with the input signal;
a magnetic field applying mechanism configured to apply a magnetic field to said magneto-resistive device; and
an output terminal connected to an output of said magneto-resistive device,
wherein said magnetic field applying mechanism includes a control section which controls the magnetic field between a first magnetic field and a second magnetic field, the first magnetic field having a direction that is inclined to the easy axis direction of said magnetic pinned layer, and having a strength whose value is such that said magneto-resistive device has a ferromagnetic resonance frequency that is identical to one of the first frequency and the second frequency, and the second magnetic field having a direction that is parallel or anti-parallel to the easy axis direction of said magnetic pinned layer, and
wherein said control section switches between a switching-on state, in which one of a difference signal and a sum signal is outputted to said output terminal by applying the first magnetic field, and a switching-off state, in which the second magnetic field is applied and the difference signal and the sum signal are not outputted to said output terminal, the difference signal having a frequency that is equal to a difference between the first frequency and the second frequency, and the sum signal having a frequency that is equal to a sum of the first frequency and the second frequency.

7. The switching apparatus according to claim 6, wherein a device size of said magneto-resistive device is 0.04 $\mu m^2$ or less.

8. The switching apparatus according to claim 6, wherein said intermediate layer includes magnesium oxide.

9. The switching apparatus according to claim 6, wherein said magnetic field applying mechanism comprises a permanent magnet and a coil for generating a magnetic field.

10. The switching apparatus according to claim 6, wherein a device resistance of said magneto-resistive device is 40 Ω.

* * * * *